United States Patent [19]

Kwon et al.

[11] Patent Number: 5,635,255
[45] Date of Patent: Jun. 3, 1997

[54] METHOD FOR PRODUCING CORROSION AND WEAR RESISTANT MEMBER BY COATING SUBSTRATE WITH AN IRON ALLOY MATERIAL POWDER

[75] Inventors: Kwang W. Kwon, Taegu; Kang H. Kim, Chinhae, both of Rep. of Korea

[73] Assignee: Samsung Heavy Industries Co., Ltd., Seoul, Rep. of Korea

[21] Appl. No.: 563,689

[22] Filed: Nov. 28, 1995

[30] Foreign Application Priority Data

May 31, 1995 [KR] Rep. of Korea ............... 95-14269

[51] Int. Cl.$^6$ ................... C22C 38/32; C23C 4/06; C23C 14/16; C23C 16/06
[52] U.S. Cl. ............ 427/456; 427/191; 427/376.6; 427/376.8; 427/531; 75/25.5; 420/64
[58] Field of Search ............ 420/42, 64; 148/325; 75/255; 427/456, 191, 376.6, 376.8, 531

[56] References Cited

U.S. PATENT DOCUMENTS

| | | | |
|---|---|---|---|
| 4,160,048 | 7/1979 | Jaeger | 427/191 |
| 4,822,415 | 4/1989 | Dorfman et al. | 420/64 |

FOREIGN PATENT DOCUMENTS

| | | | |
|---|---|---|---|
| 406322507 | 11/1994 | Japan | 427/456 |

*Primary Examiner*—Deborah Yee
*Attorney, Agent, or Firm*—Kenyon & Kenyon

[57] ABSTRACT

Erosion and wear resistant iron alloy, comprising: Cr 20.0–36.0% by weight, B 2.5–5.0% by weight, Mn 0.5–3.2% by weight, Si 0.05–0.6 by weight, Mo 0.3–2.5% by weight, V 0.05–0.3% by weight, Nb 0.03–0.3% by weight, P 0.5% by weight or less, C 0.05–0.3% by weight, and a trace of unavoidable impurities, which confers superior corrosion and wear resistance upon abraded or corroded portions by coating or molding.

10 Claims, 1 Drawing Sheet

METHOD FOR PRODUCING CORROSION AND WEAR RESISTANT MEMBER BY COATING SUBSTRATE WITH AN IRON ALLOY MATERIAL POWDER

BACKGROUND OF THE INVENTION

1. Field of the Invention

The present invention relates to an iron alloy composition superior in corrosion and wear resistance. More particularly, the present invention relates to an iron alloy composition which confers corrosion and wear resistance upon abraded or corroded portions by coating or molding. Also, the present invention is concerned with a method for preparing corrosion and wear resistant members using the same.

2. Description of the Prior Art

In the past, in order to bestow wear resistance on iron materials various techniques including carbonizing, nitrification, induction curing, chrome plating and ceramic coating were employed. However, the iron material is treated by such techniques are not sufficiently satisfying ones because of low surface hardness, brittleness or lack of adhesion strength.

Various attempts have been made to circumvent the problems but there are still have some disadvantages. For example, low temperature sulfurizing treatment, such as caubet treatment, could bring an improvement into wear resistance but, since the treated object turned out to be poor in surface pressure resistance, the treatment is not suitable for low speed and high surface pressure conditions. Electroless nickel plating is superior to other preexisting techniques in hardness and wear resistance but it has difficulty in practical use because of the many restrictions in treatment condition and it has limit in thickening surface layer.

These various problems have forced many researchers into the developing tungsten carbide sintered alloy, which is currently the most widely used. However, it Is difficult to apply the tungsten carbide sintered alloy in various fields. In practice, it is applied only for few fields including, for example, mold materials and processing tools. The reason is that mold Is required for its manufacturing. In addition, there are many problems in Impact resistance as well as time and cost.

Recently, thermal spray techniques which use Ni-based alloy or Mo, W, Zr or Nb-based alloy have been expected to overcome the above problems. Of the techniques vitrification, by which metal is made to be vitriform, has been in the limelight because it was expected basically to surmount the aforementioned problems basically.

In 1960, Duwez introduced the possibility of manufacturing vitriform alloy by quenching molten metal into the world, which was patented in U.S. Pat. No. 3,297,436 in 1967. Since then, many related patents have been yielded. Vitrification of Fe alloy was disclosed by H. S. Chen in U.S. Pat. No. 3,856,513 and a more detailed alloy composition was suggested in U.S. Pat. No. 3,986,867 to Masumoto. However, a significant disadvantage of these alloys is that, when they are produced in bulk phase, brittleness occurs because of the redundancy of phosphorous and carbon. These materials show limited vitriform property and are short of thermal resistance. Lack of thermal resistance causes them to recrystallize from the metastable vitriform phase, resulting in a loss of vitric characteristics.

SUMMARY OF THE INVENTION

It is an object of the present invention to overcome the above-mentioned problems encountered in prior arts and to provide an iron alloy which is superior in erosion and wear resistance and which shows a stable and strong toughness structure.

It is another object of the present invention to provide a method for preparing erosion and wear resistant members using the iron alloy.

DETAILED DESCRIPTION OF THE INVENTION

Figure 1:
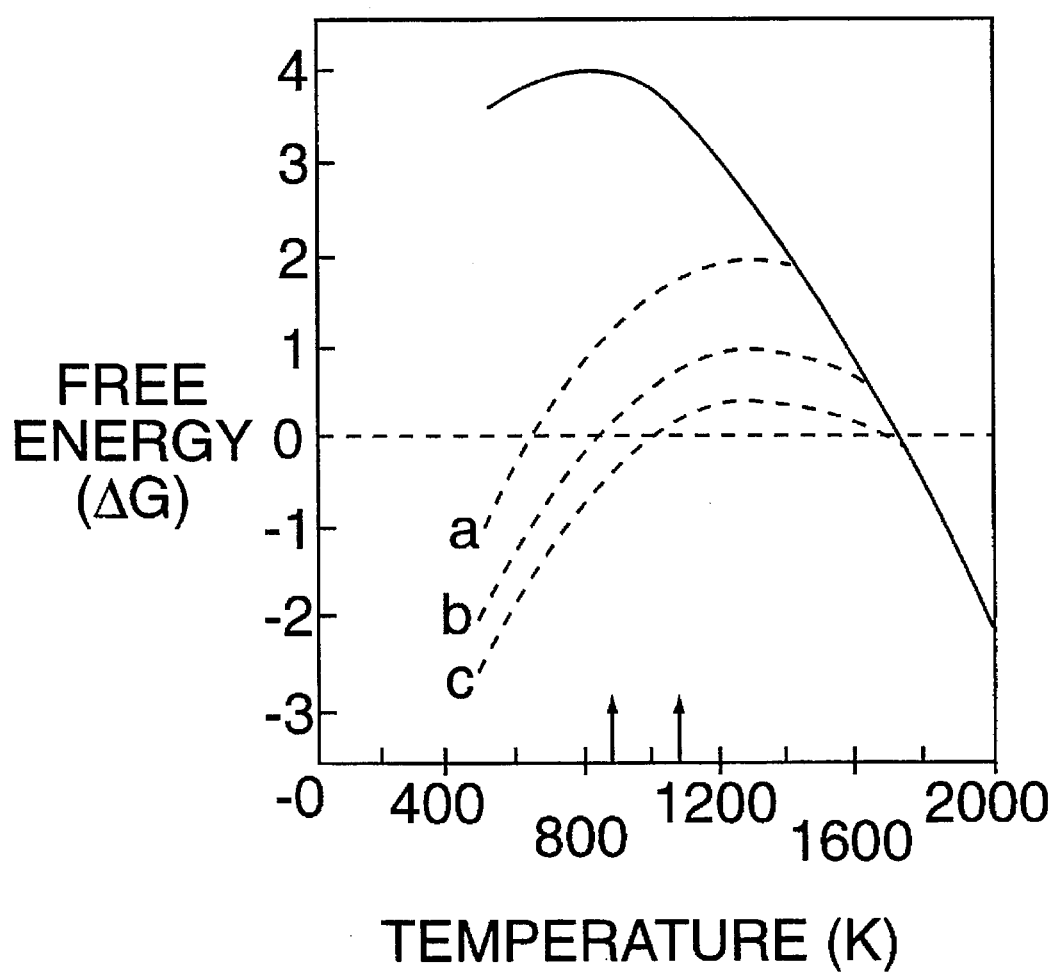
FIG. 1 in a graph showing the change of free energy with regard to temperature.

In general, it is known that metal and its alloy have crystalline structures in the solid state. Besides, it is inferred that melted metal or alloy is already in quasi-crystalline state. It is possible to vitrify a particular alloy composition by restraining long-range ordered structure from being formed therein during rapid solidification from liquid or solidification through depositing or plating, or by implanting enough ions to oversaturate essential elements, which results in difficulty forming the long-range ordered structure.

Solid vitriform is stable when metastable phase with a high free energy ($\Delta G$) is above the shear instability. As for phase stability of vitriform, where the enthalpy of mixture is far less than 0, that is, $\Delta Hmix<0$, the vitriform phase makes a condition in which it becomes stable. In order that the enthalpy of the mixture has a large absolute value with negative sign while the entropy of the mixture has a large positive value, for example, A-B type binary alloy composition should satisfy the condition of $E_{AB}>>(E_{AA}+E_{BB})/2$. Within such composition range metastable intermetallic compounds form upon solidification or subsequent thermal treatment. As temperature is lowered in a peculiar phenomenon, inverse melting, appears. In other words, the lowering of temperature causes the transformation of the solid state into a liquid state and the phase resulting from the inverse melting is of vitriform structure.

Referring to FIG. 1, there is a curve that shows the change of free energy with regard to the temperature. As shown in this figure, such transformation is a thermodynamically possible process.

In order to satisfy such spontaneous vitrification, a composition is required in which the high temperature (just below melting point, $T>0.8T_m$) phase should be present as a single phase and should be maintained as a quasi-equilibrium phase even at ordinary temperatures. In this state, an external driving force allows the metastable phase to transform into an vitriform phase. This vitriform transformation is attributed to the fact that the nucleation of stable intermetallic compound is difficult at relatively low temperatures and a distortion attributable to grid defect makes spinodal decomposition difficult.

Methods for obtaining vitriform transformation from such metastable phase include mechanical pulverization, polishing, energy scanning, cold forming and quenching through thermal treatment. The present inventors have recognized that a metastable phase, after being established, would be possible to vitrify even with abrasive stress and researched for materials which could be vitrified with shear stress resulting from vertical load and abrasion. In this regard, the free energy of the above-mentioned intermetallic compound-forming alloy can be heightened by increasing the number of grid defects in metastable solid solution. On the basis of this, an iron alloy composition has been developed that can be spontaneously vitrified from metastable crystalline state to a super-cooled liquid state through inverse melting.

In the invention, whether the wear-resistant material is coated on a part of article or is used as the whole material of article, it is initially in a metastable crystalline state and is subjected to stress-induced vitrification by high surface pressure during processing. Besides, even though the material of the present invention is not in vitriform state, it is a stainless steel composition which is superior in corrosion resistance and toughness by virtue of Cr, Al and Mo alloy elements and in wear resistance by virtue of B element.

The present invention provides a method for producing an iron alloy whose outermost surface is maintained by stress induction when it is subjected to vitrification and which shows corrosion and wear resistance even in a non-vitriform state, and the application techniques thereof. One of the problems generated in conventional wear-resistant iron alloy is that, because the improvement of wear resistance by high hardness is accompanied by extreme degradation of toughness, resulting in lack of impact resistance, there is a limit in applying the iron alloy for an article of bulk state. In order to solve the problem, the method of the present invention comprises the formation of a metastable solid solution to reinforce the solid solution, thereby maintaining wear resistance. Particularly, the outermost surface in abrasion-worn portion of the iron alloy is vitrified by stress-induced transformation, which results in bringing superior physical properties into surface. Accordingly, while supporting the high hardness surface layer the base of the coating layer showing the metastable phase absorbs impulsive load. Meanwhile, the surface is responsible for vertical load or shear stress. As a result, toughness and wear resistance are provided.

Preexisting ceramic materials are known to have high hardness and superior wear resistance but, in practice, their uses are extremely limited owing to their brittleness. To overcome this, a slope-functioning material is conventionally employed to relieve the hardness difference from the base layer and to improve adhesion thereto. However, in the present invention, the coating layer itself is of a metastable phase and has a hardness of HV 500 to 700 by virtue of solid solution reinforcement and, when the outermost surface is subjected to vitrification, it has a hardness of HV 1200 or higher, showing a natural hardness slope. In addition, while the surface layer plays a role of lowering the friction coefficient in order not to generate serious abrasion scars, such as scoring and wipering, the base layer uniformly disperses the surface pressure to show high adhesion strength. These properties of the present invention complement the disadvantages of the preexisting ceramic materials.

Basically, the wear resistant iron alloy of the present invention is formed into bulk and powder state. In the case of powder, there may be used (1) pulverization after induction melting in vacuum, (2) pulverization after remelting at least once in vacuum arc furnace, (3) quench solidification using melt spinning or atomization, or (4) mechanical alloying of raw material powder. After being subjected to surface treatment, the powder obtained by such methods can be coated, giving the excellent corrosion and wear resistance.

For bulk state, secondary materials made by conventional casting methods using centrifugal casting or moulds are cut into sizes suitable for use or subjected to machining and, then, only surfaces of desired potions are rapidly heated by use of high frequency induction heating, electric beam irradiating or laser surface treatment, so as to construct a metastable phase on the surface. Meanwhile, it is difficult to obtain the metastable phase from the casting state itself. In accordance with the present invention, a rapidly solidified layer on a surface can be obtained with a rotating centrifugal castor or molding castor by inserting molten metal in a pipe type mould. This is what results from the application of effect of rapid solidification, an applied process in preparing powder, for bulk materials. Cooling rate can be controlled by winding a cooling line round a mould. Likewise, the same effect can be achieved in mold casting.

In accordance with an aspect of the present invention, there is provided an iron alloy, comprising Cr 20.0–36.0% by weight, B 2.5–5.0% by weight, Mn 0.5–3.2% by weight, Si 0.05–0.6% by weight, Mo 0.3–2.5% by weight, V 0.05–0.3% by weight, Nb 0.03–0.3% by weight, P 0.5% by weight or less, C 0.05–0.3% by weight, and a trace of unavoidable impurities with a preference of Cr 26.0–28.0% by weight, B 3.2–3.6% by weight, Mn 0.3–1.0% by weight, Si 0.2–0.5% by weight, V 0.1–0.3% by weight, Nb 0.05–0.2% by weight and the sum of P and C 0.5% or less.

In accordance with another aspect of the present invention, there is provided a method for preparing wear-resistant members from powder of the iron alloy material, comprising (1) coating by plasma, arc or flame thermal spray;

(2) sputtering with said powder serving as a target;

(3) ion plating or evaporation with said powder serving as a source;

(4) thermal spraying or cladding-by-welding of a cored wire including said powder on the surface of various base material; or (5) slurry coating a member with said powder, thermal coating it in induction or electric furnace, atmosphere furnace or vacuum furnace, and cutting with press and forming.

In accordance with a further object of the present invention, there is provided a method for preparing wear-resistant members from the bulk iron alloy by centrifugal or mold casting of molten metal, comprising a surface-treatment technique by which the surface of said member can be heated rapidly up to just below the melting point, such as (1) high frequency induction hardening;

(2) laser hardening; or (3) electrical beam irradiating.

A detailed description will be given of the iron alloy composition.

Together with Fe, Cr forms into homogeneous solid solution and is the most important element to improve strength and corrosion resistance. In the present invention, Cr is added at an amount of at least 20% by weight. This amount of Fe is necessary to restrain the long-range ordered structure at just below the melting point, thereby allowing the metastable phase, the necessary condition for vitrification at ordinary temperatures, to be formed. If Fe is added at an amount less than 20% by weight, α-ferrite phase may be rapidly formed in liquid state, which is a type of partitionless transformation not requiring the partition of composition. Thus, it becomes difficult to restrain the transformation into α-ferrite phase, a crystalline phase, which gives difficulty to forming the vitriform phase. On the other hand, if Fe is added at an amount more than 36.0% by weight, a driving force may occur which exists as a stable mixture phase of α-ferrite and Cr, deleteriously affecting the formation of vitriform phase.

The addition of semi-metal element is indispensable to obtain the vitriform phase. In this regard, B plays an important role in the present alloy composition. B lowers the melting point and reacts with Fe and Cr to form compounds, $Fe_2B$ and $Cr_2B$, which form homogeneous solid solution additionally and show metastable phase at ordinary temperatures. In addition, $Fe_2B+Cr_2B$ forms an absolute solid solution at high temperatures which is helpful in the formation of the metastable phase at ordinary temperatures, the base for solid phase vitriform transformation, thereby promoting vitrification of the alloy. B is preferably added at an amount ranging from 2.5 to 5% by weight. For example, if too little B is used, the amount of $Fe_2B+Cr_2B$, important for formation of metastable phase, is reduced, to increase barrier of vitriform transformation. On the other hand, if B is used at amounts more than 5% by weight, other intermetallic compounds than $Fe_2B$, such as FeB, CrB and $Cr_3b_4$, may be formed, which have a tendency to be stable crystalline structure in addition to preventing formation of homogeneous solid solution at just below melting point.

Mn has an effect of widening the partial band upon generation of stacking fault by lowering the stacking fault energy. In turn, this effect increases dislocation density in the metastable crystalline phase, to promote the differentiation of dislocation with energy provided from an external pressure. Within the alloy occurs a large strain energy that is helpful for stable vitriform phase. Also, Mn serves as an important austenizing element in steel, transforming instable austenite structure into martensite through working. Mn has high work hardenability and shows erosion resistance, when receiving repetitive impulsive working attributed to cavity, in a wet atmosphere. By virtue of the erosion resistance, electrical corrosion and pitting can be prevented, thereby showing high wear and corrosion resistance while maintaining a low friction coefficient. These effects of Mn cannot be expected at an amount of less than 0.5% by weight. If Mn is used at an amount more than 3.2% by weight, gamma-Fe, i.e. austenite appears, inversely affecting the restraint of vitriform phase.

Si reinforces alpha-ferrite and improves the base strength when being vitrified. Si is helpful for vitrification at an amount of more than 0.2% by weight while such compounds as $Fe_3Si$ and $Fe_2Si$ start to appear at the amount of Si more than 1% by weight.

Since P is one of the vitrifying elements, it can be added but its amount in Fe system is confined to no more than 0.5% by weight or less in order to prevent brittleness.

C is a strong element to reinforce Fe but its amount is confined into a range of 0.05–0.3% by weight in order to prevent brittleness and to constrain the formation of carbides. A trace of C reacts with alloying elements, such as V and Nb, to form extremely fine carbide which not only contributes to fineness of the particle size distribution in metastable phase, to improve toughness, but serves to strengthen high temperature strength.

Mo plays a role in forming and reinforcing α-ferrite. In addition, it exhibits an effect of autogenous alloy. Mo is added up to 2.5% by weight because excess amount does not affect any longer. Mo, which has a great influence on high temperature, is added at at least 0.3% by weight. Preferably, it is added at an amount of 2% by weight in view of workability and toughness.

As mentioned previously, F and Nb react with C to precipitate fine carbides which are helpful to improve the high temperature strength and to prevent the growth of particle size in the metastable phase. Particularly, V contributes to the improvement in high temperature creep strength. When the sum of V and Nb is above 0.4% by weight, coarse carbides occur, deleteriously affecting toughness and mechanical properties. Basic addition effect of this alloying metal can be achieved at at least 0.05% by weight.

A better understanding of the present invention may be obtained in light of following examples which are set forth to illustrate, and are not to be construed to limit, the present invention.

Alloy materials that had compositions indicated in Table 1 below were made powders by atomization, which were then classified into an average particle size of 50 microns.

TABLE 1

| | Unit: wt % | | | | | | | | | |
|---|---|---|---|---|---|---|---|---|---|---|
| Exam. | Cr | B | Mn | Si | P | C | Mo | V | Nb | Fe |
| A | 26.7 | 3.42 | 1.06 | 0.52 | 0.01 | 0.15 | 0.8 | 0.1 | 0.05 | bal. |
| B | 27.4 | 4.1 | 1.84 | 0.30 | 0.02 | 0.21 | 1.2 | 0.15 | 0.07 | bal. |
| C | 27.2 | 3.86 | 1.44 | 0.31 | 0.01 | 0.15 | 1.6 | 0.11 | 0.06 | bal. |

These uniform powders each were coated on S45C-based disks by plasma thermal spray and the resulting coating layers were polished until the thickness thereof was reduced into about 0.2 mm.

After S45C (AISI 1045) was subjected to quenching and then to tempering, induction hardening was effected on counter rings so that their contact moving surfaces might have a hardness of HRC56-58.

In the examples, load carrying capacity test (LCCT) and endurance limit test (ELT) were carried out at P-250 kgf/cm2 and V-2.58 mm/min in the absence of lubricating oil. For LCCT, the increment of load was 50 kg and each load was maintained for 1 min. Thereafter, ELT was followed. In this test, the times at which the coating layers were initiated into abrasion were determined as change points of torque. The results are shown in Table 2 below. These tests are based on the present inventors' experiences that, in the presence of lubricating layer, abrasion scars, such as scoring and wipering, are hardly generated but, in the absence of a lubricating layer, which may be caused under high surface pressure, such as local contact state, friction between metal and metal occurs, generating high temperatures in a mement, which damage the surfaces of the metals. Accordingly, the tests through which the maximum of the surface pressure resistance and the duration time are determined in the absence of lubricating layer are very important to assay the performance of the surface.

In most cases, the coating layers have largely different hardnesses from those of the base structures. As hardness increases toughness decreases. In the case that the coating layer is thicker than 2 mm, the porosity in the coating layer increases, which results in initiating break therein. Therefore, the thickness of the coating layer is confined up to 2 mm, in accordance with the present invention. Also, the present inventors knew from various experiments that there exists a need of securing at least 0.1 mm coating layer under a surface pressure of 200 kgf/cm². On the basis of the experiences of the present inventors, the optimum thickness of the coating layer is 0.2 mm, depending on the surface pressure and friction rate.

TABLE 2

| Exam. | No. | Initial Abras. (sec) | Transfer by Serious Abras. (sec) | Final Temp. of Specimens (°C.) | Dynamic Frict. Coeffi. (μ) | Weight Loss (%) |
|---|---|---|---|---|---|---|
| A | A-1 | 1450 | 2950 | 85 | 0.106 | 0.009 |
|   | A-2 | 1680 | 3260 | 88 | 0.097 | 0.011 |
| B | B-1 | 1518 | 3420 | 92 | 0.084 | 0.015 |
|   | B-2 | 1620 | 3610 | 89 | 0.079 | 0.013 |
| C | C-1 | 1526 | 3340 | 86 | 0.086 | 0.012 |
|   | C-2 | 1598 | 3460 | 88 | 0.89 | 0.010 | note:
Hardness in plasma thermal spray state: HV(500 g)480–660
Outermost surface hardness after polishing: HV(10 g)1250–1450
Thermal spray layer thickness: 0.18–0.22 mm
Hardness of base material: HV(500 g)230–270

As apparent from Table 2, the present examples A, B and C all show good dynamic friction coefficients not more than 0.15.

TABLE 3

| No. | Specimen Treatment Ring | Specimen Treatment Disk | Dynamic Friction Coefficient | Remark |
|---|---|---|---|---|
| 1 | HF hardening | HF hardening | 0.72 | Comparative |
| 2 | HF hardening | PTFE coating | 0.07* | Examples |
| 3 | HF hardening | Cu alloy + Graphite insert | 0.13–0.23 |  | note *: test not determined, low friction coefficient but extreme weight loss owing to lack of strength.

From the tables, it is apparent that the friction-worn portions can remarkably improved in corrosion and wear resistance by coating the iron alloy of the present invention thereon.

Other features, advantages and embodiments of the present invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for producing wear-resistant members, comprising the steps of:

providing powder of an iron alloy material including Cr 20.0 to 36.0% by weight, B 2.5 to 5.0% by weight, Mn 0.5 to 3.2% by weight, Si 0.05 to 0.6% by weight, Mo 0.3 to 2.5% by weight, V 0.05 to 0.3% by weight, Nb 0.03 to 0.3% by weight, P 0.5% by weight or less, C 0.05 to 0.3% by weight, and a trace of unavoidable impurities;

performing thermal spraying or cladding-by-welding said powder on the surfaces of worn members to form a coating layer.

2. A method in accordance with claim 1, wherein said powder of an iron alloy material comprises Cr 26.0 to 28.0% by weight, B 3.2 to 3.6% by weight, Mn 0.3 to 1.0% by weight, Si 0.2 to 0.5% by weight, V 0.1 to 0.03% by weight, Nb 0.05 to 0.2% by weight and the sum of P and C 0.5% or less.

3. A method for producing wear-resistant members, comprising the steps of:

providing powder of an iron alloy material including Cr 20.0 to 36.0% by weight, B 2.5 to 5.0% by weight, Mn 0.5 to 3.2% by weight, Si 0.05 to 0.6% by weight, Mo 0.3 to 2.5% by weight, V 0.05 to 0.3% by weight, Nb 0.03 to 0.3% by weight, P 0.5% by weight or less, C 0.05 to 0.3% by weight, and a trace of unavoidable impurities;

slurry coating a substrate with said powder;

subjecting the coating layer to thermal coating in an induction or electric furnace, atmosphere furnace or vacuum furnace;

cutting the coated substrate with a press; and molding by winding.

4. A method in accordance with claim 1, wherein said thermal coating layer is effected through thermal spray with plasma, arc or flame.

5. A method in accordance with claim 1, wherein said thermal coating layer is effected through a sputtering process using said powder as a target.

6. A method in accordance with claim 1, wherein said thermal coating layer is effected through an ion plating or depositing process using said powder as an evaporation source.

7. A method in accordance with claim 1, wherein said coating layer has a thickness ranging from 0.1 to 0.7 mm and a hardness of HV 500 of more with regard to a friction surface with a surface pressure of 200 kgf/cm².

8. A method in accordance with claim 2, wherein said coating layer has a thickness ranging from 0.1 to 0.7 mm and a hardness of HV 500 of more with regard to a friction surface with a surface pressure of 200 kgf/cm².

9. A method in accordance with claim 5, wherein said coating layer has a thickness of 0.5 to 10 μm and a hardness of HV 500.

10. A method in accordance with claim 6, wherein said coating layer has a thickness of 0.5 to 10 μm and a hardness of HV 500.

* * * * *